United States Patent [19]

Mitchener

[11] Patent Number: 4,845,054
[45] Date of Patent: Jul. 4, 1989

[54] LOW TEMPERATURE CHEMICAL VAPOR DEPOSITION OF SILICON DIOXIDE FILMS

[75] Inventor: James C. Mitchener, Mountain View, Calif.

[73] Assignee: Focus Semiconductor Systems, Inc., Sunnyvale, Calif.

[21] Appl. No.: 68,727

[22] Filed: Jun. 29, 1987

Related U.S. Application Data

[63] Continuation of Ser. No. 744,838, Jun. 14, 1985, abandoned.

[51] Int. Cl.$^4$ ............................................. H01L 21/316
[52] U.S. Cl. ........................... 437/238; 148/DIG. 118; 427/255.3; 423/337; 437/240
[58] Field of Search ................... 437/235, 238; 427/95, 427/85, 87, 255.2, 255.3; 423/335, 337

[56] References Cited

U.S. PATENT DOCUMENTS

| | | |
|---|---|---|
| 3,093,507 | 6/1963 | Lander et al. ......... 148/DIG. 118 X |
| 3,243,363 | 3/1966 | Helwig ..................... 204/164 |
| 3,473,959 | 10/1969 | Ehinger et al. ............... 117/201 |
| 3,614,548 | 10/1971 | Inoue ..................... 317/234 |
| 3,934,063 | 1/1976 | Burt et al. ................. 427/95 |
| 4,099,990 | 7/1978 | Brown et al. ............... 148/6.35 |
| 4,282,268 | 8/1981 | Priestly et al. ............. 427/39 |

FOREIGN PATENT DOCUMENTS

| | | | |
|---|---|---|---|
| 0037197 | 4/1978 | Japan .................... | 423/337 |
| 0012730 | 4/1980 | Japan . | |

OTHER PUBLICATIONS

Secrist, D. R., et al, *Journal of the Electrochemical Society*, vol. 113, No. 9, Sep. 1966, pp. 914–920.
*Kirk–Othmer Encyclopedia of Chemical Technology*, vol. 14, 1967, John Wiley & Sons, TP9E68.
Klerer, J., *J. of Electrochem. Soc.*, No. 1961, vol. 108, No. 11, pp. 1070–1071.
Berkenblitz et al, *IBM Tech. Disc. Bull.*, vol. 13, No. 5, Oct. 1970, p. 1297.
Belyakova et al, *Chemical Abstract*, vol. 85, 1976, p. 485, 115517w.
Adams et al, *J. of Electrochem. Soc.*, Jun. 1979, vol. 126 (6), pp. 1042–1046.
Tchakuk et al, *Chem. Abstract*, vol. 71, 1969, p. 384, 54672.
Zagata et al, *Chem. Abstract*, vol. 89, 1978, p. 879, 122291d.

*Primary Examiner*—Brian E. Hearn
*Assistant Examiner*—T. N. Quach
*Attorney, Agent, or Firm*—Skjerven, Morrill, MacPherson, Franklin & Friel

[57] ABSTRACT

A method for low temperature chemical vapor deposition of an $SiO_2$ based film on a semiconductor structure using selected alkoxysilanes, in particular tetramethoxysilane, trimethoxysilane and triethoxysilane which decompose pyrolytically at lower temperatures than TEOS (tetraethoxysilanes). Ozone is introduced into the reaction chamber to increase deposition rates, lower reaction temperatures and provide a better quality $SiO_2$ film by generating a more complete oxidation. Ozone is also employed as a reactant for doping $SiO_2$ based films with oxides of phosphorus and boron.

1 Claim, 2 Drawing Sheets

LOW TEMPERATURE CHEMICAL VAPOR DEPOSITION OF SILICON DIOXIDE FILMS

This application is a continuation of application Ser. No. 06/744,838, filed June 14, 1985 now abandoned.

FIELD OF THE INVENTION

This invention relates to a method for depositing an $SiO_2$ based dielectric film on a semiconductor structure and in particular to a method for low temperature chemical vapor deposition of $SiO_2$ films using a selected alkoxysilane.

BACKGROUND OF THE APPLICATION

Tetraethoxysilane (TEOS) has been used extensively as the source material for the chemical vapor deposition (CVD) of an $SiO_2$ layer on a semiconductor wafer. U.S. Pat. No. 3,934,060, issued to Burt et al. on Jan. 20, 1976, describes on such prior art process.

In a typical prior art process nitrogen is used as the carrier gas which is passed over or bubbled through the TEOS which is held in a source container. The wafers to be covered with a deposited $SiO_2$ film are laid in a furnace boat in a furnace tube into which the TEOS vapor entrained in the carrier gas is introduced and the wafers are heated to a selected temperature at which the TEOS pyrolytically decomposes. The range of temperatures less than approximately 960° C. at which TEOS pyrolytically decomposes is well known. As the temperature of the wafers is reduced the decomposition rate and the film deposition rate decrease until they appear to stop. As a practical matter the range of temperatures typically employed ranges between 650° C. and 950° C. While the growth rate is lower for temperatures at the lower end of the range, these lower temperatures have the advantage of causing less thermal damage to the semiconductor circuit embedded in the underlying silicon wafer. These lower temperatures are also more compatible with metalization schemes using aluminum and its alloys.

U.S. Pat. No. 3,934,060, referred to above, describes an improvement in the geometry and deposition technique of the typical prior art process, which results in a more uniform coverage of the wafers by the $SiO_2$ film.

It is also known that the growth rate of the $SiO_2$ layer can be enhanced by using oxygen as a carrier gas (See U.S. Pat. No. 3,614,584, issued to Inoue on Oct. 19, 1971). The Inoue patent also describes a method for depositing TEOS using tetraethoxysilane as a source together with triisopropyl titanate in order to deposit a composite insulating layer of $TiO_2$-$SiO_2$ where the $TiO_2$ constitutes less than 0.02% by weight of the layer. Inoue employs the temperature range of 300° C. to 500° C. for the above process. Other methods using plasma deposition techniques are known for depositing an $SiO_2$ based film on a video disk. For U.S. Pat. No. 4,282,268, issued Aug. 4, 1981 to Priestley et al., which is incorporated herein by reference, describes a method for forming an $SiO_2$ layer on a video disk by introducing into an evacuated chamber a dielectric precursor having the formula

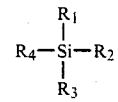

where $R_1$ is selected from the group H and $-CH_3$, $R_2$ and $R_3$ are independently selected from the group consisting of H, $-CH_3$, $-OCH_3$ and $-OC_2H_5$ and $R_4$ is selected from the group consisting of $-OCH_3$ and $-OC_2H_5$. The $SiO_2$ layer is deposited onto the disk using a glow discharge. This method has proven unsuitable for depositing an $SiO_2$ based film on a semiconductor wafer because the deposited film has a poor dielectric quality, low density and is highly particulate, and because the deposited film has poor step coverage.

SUMMARY OF THE INVENTION

In contrast to the prior art use of TEOS for the pyrolytic decomposition of $SiO_2$ based films on semiconductor structures the present invention utilizes other selected alkoxysilanes which permit the reactions to proceed at lower temperatures and at higher deposition rates. In one embodiment, the semiconductor structure is heated to a selected temperature less than or equal to 900° C. and an alkoxysilane selected from the group consisting of tetramethoxysilane, a trialkoxysilane having the formula

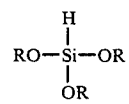

where R is a methyl, ethyl or propyl group, a dialkoxysilane having the formula

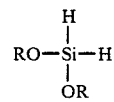

where R is a methyl, ethyl, or propyl group or a vinyltrialkoxysilane having the formula

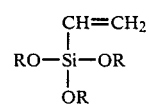

where R is a methyl or ethyl group. Oxygen and/or nitrogen are used as a carrier gas with oxygen being preferred. When the wafer temperature is reduced to a range between 550° C. and 650° C. the alkoxysilane may be selected to be tetramethoxysilane, triethoxysilane or trimethoxysilane. When the reaction temperature is selected to be between 350° C. and 550° C. the alkoxysilane selected may be tetramethoxysilane or trimethoxysilane.

It has also been discovered that when ozone is introduced into the reaction chamber along with nitrogen or oxygen, with the concentration of ozone preferably being less than or equal to 10% by weight, the reaction rate is increased by nearly an order of magnitude for alkoxysilanes. Alternatively, this introduction of ozone permit the reaction to proceed at lower temperatures for a given $SiO_2$ deposition rate. For example, using a trialkoxysilane (including a vinylalkoxysilane) or a dialkoxysilane the wafer temperature may be selected to be in the range of 350° C. to 500° C. A temperature in this range has distinct advantages in semiconductor processing since it is compatible with the wafer metalization and there is little or no thermal damage to the electrical properties of the circuits embedded in the silicon wafer. It has also been discovered that the use of ozone in the reaction chamber permits the doping of the $SiO_2$ film with oxides of phosphorous and boron at temperatures between 350° C. and 900° C. The use of ozone in this connection provides an important advantage over the prior art since it greatly reduces the temperatures at which the doping oxides are formed compared to those required when oxygen alone is used as a carrier gas.

DETAILED DESCRIPTION

Figure 1:
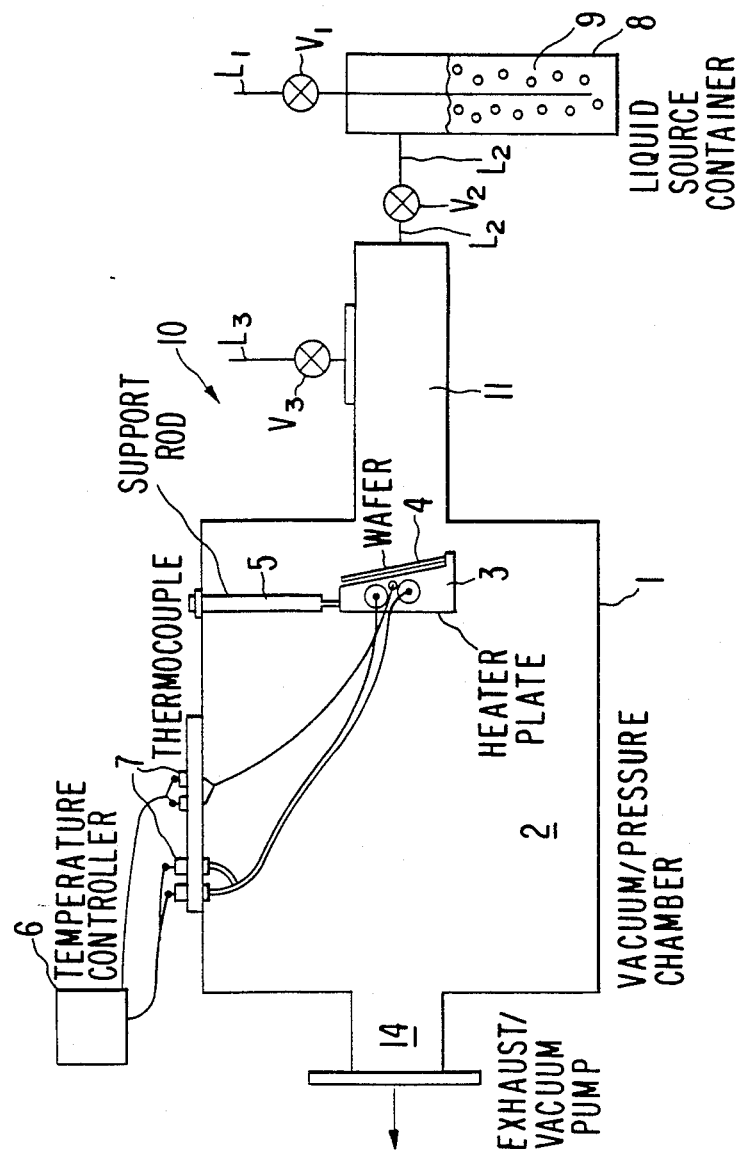
FIG. 1 shows a reactor suitable for employing the methods of this invention.

FIG. 1 shows a cross-sectional schematic diagram of a microreactor 10 for employing the methods of the present invention for chemical vapor deposition of an $SiO_2$-based dielectric film on a semiconductor structure, for example a silicon wafer. Microreactor 10 is described in a copending application of Imad Mahawili entitled "Microreactor," U.S. Ser. No. 745,336, now abandoned, filed with the U.S. Patent and Trademark Office on June 14, 1985. Microreactor 10 includes housing 1 surrounding reactor chamber 2. Housing 1 is made of stainless steel or other inert material which does not react with the gases introduced into chamber 2. Heater plate 3, typically a block made of stainless steel, is held in position in chamber 2 by support rod 5 attached to housing 1. Silicon wafer 4, upon which the $SiO_2$-based film is to be deposited, is placed on heater plate 3. The temperature of plate 3 is regulated by temperature controller 6 which is connected through thermocouple 7 to a cartridge heater embedded in heater plate 3.

Silicon wafer 4 rests upon heater plate 3 and is heated thereby to a selected temperature as determined by temperature controller 6. Reactor 10 can be operated in the isothermal or cold-wall modes for a range of temperatures from room temperature up to 900° C. Exhaust chamber 14 is connected to a vacuum pump (not shown) so that microreactor 10 can be operated at reduced pressures, if desired. In the methods of depositing $SiO_2$-based films described herein, reactor 10 was operated at pressures ranging from atmospheric pressure down to 0.5 torr.

An alkoxysilane 9 is introduced into bubble chamber 8 at atmospheric pressure and room temperature (at room temperature, alkoxysilanes are generally in liquid form). A carrier gas such as nitrogen or oxygen is introduced via gas line $L_1$. The flow rate of the carrier gas into alkoxysilane 9 in bubble chamber 8 is regulated by control valve $V_1$. The carrier gas, together with alkoxysilane vapor, flows from bubble chamber 8 via gas line $L_2$ to the elongated portion 11 of reactor chamber 2 as shown in FIG. 1. The flow rate through line $L_2$ is controlled by valve $V_2$. A second selected mixture of one or more gases, for example oxygen, nitrogen, or ozone, may also be introduced into the elongated portion 11 of chamber 2 via line $L_3$, which is regulated by flow rate control valve $V_3$.

The above chemical vapor deposition reactor was used in order to study the deposition rates of $SiO_2$-based films for selected alkoxysilanes not previously used for the chemical vapor deposition of $SiO_2$-based films on semiconductor wafers. Wafer 4 was maintained at various selected temperatures for selected carrier gases introduced via line $L_1$ and for selected gases introduced via line $L_3$. The deposition rate for the $SiO_2$-based film using prior art alkoxysilane tetraethoxysilane Si-$(OC_2H_5)_4$(TEOS) was used as a control process. Absolute deposition rates were not measured for the alkoxysilanes tested. However, relative rates were determined by visual inspection of the deposited $SiO_2$ film. The reactor was operated in both the cold wall mode and the hot wall mode.

| CONTROL PROCESS 1 | |
|---|---|
| Alkoxysilane: | tetraethoxysilane (TEOS) $Si(OC_2H_5)_4$, electronic grade 99.9% pure; molecular weight, 208.3 g/mole; boiling point 169° C. |
| Carrier gas via line $L_1$: | Nitrogen |
| Gas via line $L_3$: | None (line $L_3$ off) |
| Flow rate via line $L_1$: | 20–100 sccm (20, 50, 100) sccm |
| Flow rate via line $L_3$ | 0 |
| Wafer temperature: | 650° C.–900° C. (650°, 700°, 750°, 900°) ±20° C. |
| Reaction time: | 15–30 minutes (15, 30) minutes |
| Pressure: | 1 atmosphere to 0.5 torr (1 atmosphere, (10, 5, 0.5) torr) |

Control process 1 was carried out for the specific choices of flow rates, temperatures and pressures indicated in parentheses.

EXAMPLE 1

Same as control process 1 except tetramethoxysilane, $Si(OCH_3)_4$ having a molecular weight of 152.2 g/mole and a boiling point of 121°–122° C. was used in place of tetraethoxysilane.

EXAMPLE 2

Same as control process 1 except triethoxysilane H-$Si(OC_2H_5)_3$, having a molecular weight of 164.3 g/mole and a boiling point of 131.1° C. was used in place of tetraethoxysilane.

EXAMPLE 3

Same as control process 1 except that trimethoxysilane, H-$Si(OCH_3)_3$, 95% pure, having a molecular weight of 122.2 and a boiling point of 86°–87° C. was used in place of tetraethoxysilane.

Control process 1 and examples 1 through 3 all yielded $SiO_2$ films with the following relative deposition rates, r: r(tetraethoxysilane) < r(triethoxysilane) < r(tetramethoxysilane) < r(trimethoxysilane).

CONTROL PROCESS 2

Same as control process 1, except that 99.999% pure $O_2$ was used as the carrier gas via line 1 in place of nitrogen. Again control process 2 was carried out for the specific choices of flow rates, temperatures and pressures within the ranges stated as indicated by the values in parentheses.

EXAMPLE 4

Same as control process 2, except that tetramethoxysilane was used in place of tetraethoxysilane.

EXAMPLE 5

Same as control process 2, except that triethoxysilane was used in place of tetraethoxysilane.

EXAMPLE 6

Same as control process 2, except that trimethoxysilane was used in place of tetraethoxysilane.

Control process 2 and examples 4 through 6 all yield SiO₂ films with the following relative deposition rates: r(tetraethoxysilane)<r(triethoxysilane)<r(tetramethoxysilane)<r(trimethoxysilane).

An examination of the above processes and examples showed that corresponding reaction rates were increased when oxygen was used as a carrier gas in place of nitrogen.

CONTROL PROCESS 3

Same as control process 2, except that the wafer temperature was 550°-650° C. (550° C., 600° C., 650° C.) ±20° C. were the actual wafer temperatures employed.

Examples 7, 8 and 9 are the same as examples 4, 5 and 6, except that the wafer temperature was a selected temperature in the range 550°-650° C. (550° C., 600° C., 650° C.) ±20° C. were the wafer temperatures selected. The deposition rates in this lower temperature range were ordered in the same way as given for examples 4, 5 and 6; however, it was noted that very little SiO₂ film was deposited for TEOS (tetraethoxysilane).

CONTROL PROCESS 4

Same as control process 2, except that wafer temperature was reduced to a selected temperature in the range 450°-550° C. Examples 10, 11 and 12 are the same as examples 4, 5 and 6, except that the wafer temperature was a selected temperature in the range 450° C. to 550° C. The temperatures selected were 450° C., 500° C., and 550° C. ±20° C. At these lower temperatures, no SiO₂ film was formed using the control process 4 or the example process number 11. An SiO₂ film was formed in examples 10 and 12 with the SiO₂ deposition rate r(tetramethoxysilane)<r(trimethoxysilane).

CONTROL PROCESS 5

Same as control process 2 except that the wafer temperature was a selected temperature in the range 350°-450° C. The selected temperatures were 350° C., 400° C. and 450° C. ±20° C.

Examples 13, 14, and 15 are the same as examples 4, 5, and 6 except that the wafer temperature was in the range 350°-450° C. At these reduced temperatures, no SiO₂ film was formed using the method of control process 5 or example 14. A very thin film formed using the process of example 13. A thicker film was formed using the process of example 15, i.e., r(tetramethoxysilane)<r(trimethoxysilane).

The above examples for semiconductor applications demonstrate that an SiO₂ film of good dielectric quality can be deposited from decomposition of various alkoxysilanes other than TEOS. The use of tetramethoxysilane, triethoxysilane and trimethoxysilane permits lower wafer temperatures (≦650° C.) than prior art TEOS, which is deposited at temperatures between 650° C. and 900° C.

In particular, a good quality SiO₂ based film is deposited using tetramethoxysilane or trimethoxysilane at wafer temperature as low as 350°-550° C., good quality SiO₂ based film is deposited using tetramethoxysilane, trimethoxysilane, and triethoxysilane at wafer temperatures of 550° C. to 650° C. Moreover, in the temperature range 550° to 650° C., the deposition rate of the SiO₂ based film was greater using tetramethoxysilane, trimethoxysilane and triethoxysilane than the deposition rate using TEOS.

Depositing an SiO₂ based film on an IC silicon wafer using these lower reaction temperatures has an important advantage over the higher temperature reaction required when using TEOS: the electrical properties of the integrated circuit wafer are less affected by lower temperature processing. For example, lower temperature processing causes less diffusion of dopants in the underlying integrated circuit and is more compatible with aluminum metalization.

The use of the methoxysilanes described above has the added advantage that they reduce the amount of residual carbon in the deposited SiO₂ based film, which enhances the dielectric quality of the film.

In Examples 1 through 15, above, the alkoxysilanes used were tetramethoxysilane, triethoxysilane or trimethoxysilane.

However, in general the following alkoxysilanes may be employed with the method of this invention:

(1) a trialoxysilane having the formula

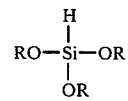

where R=a methyl (CH₃), ethyl (C₂H₅), or propyl (C₃H₇) group (2) a dialkoxysilane having the formula

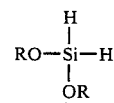

where R=a methyl (CH₃), ethyl (C₂H₅), or propyl (C₃H₇) group (3) a tetramethoxysilane

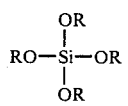

where R=methyl (CH₃), or (4) a vinyltrialkoxysilane having the formula

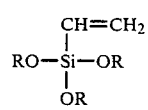

where R=a methyl (CH₃), or ethyl (C₂H₅) group

It has also been discovered that important advantages can be obtained using ozone as a reactor gas, in particular:

(1) for selected alkoxysilanes, such as trialkoxysilanes, vinyltrialkoxysilanes, and dialkoxysilanes, the wafer temperature may be reduced to the range of 300°–500° C., a temperature which does not adversely affect the properties of active and passive devices formed in and on the wafer surface;

(2) for the temperature range 300°–900° C. a better quality $SiO_2$ dielectric film having lower residual carbon is obtained due to a more complete oxidation reaction;

(3) the deposition rate of the $SiO_2$ dielectric film is increased; and (4) doping of the $SiO_2$ film with both phosphorous and boron oxides is readily achievable.

Example 16, below, provides one example of the use of ozone in the chemical vapor deposition of $SiO_2$ based films.

In example 16, where ozone is employed as a reactant gas, one may use any alkoxysilane including tetraethoxysilane (TEOS).

EXAMPLE 16

| Alkoxysilane: | tetraethoxysilane, tetramethoxysilane, triethoxysilane, or trimethoxysilane |
|---|---|
| Carrier gas via line $L_1$: | $O_2$ or Nitrogen |
| Reactant gas via line $L_3$: | $O_2$ and less than 10% ozone by weight |
| Flow rate for carrier gas via line $L_1$: | 20–100 sccm (20, 50, 100) sccm |
| Flow rate for gas via line $L_3$: | 20–200 sccm (20, 50, 100, 200) sccm |
| Wafer temperature: | 300–900° C. (300° C., 350° C., 400° C., 500° C., 600° C., 700° C., 800° C., 900° C.) ±20° C. |
| Pressure: | 1 atmosphere to 0.5 torr (1 atmosphere, (10, 5, 0.5) torr) |

(The values of the parameters in parenthesis indicate the values tested)

Example 16 may be modified by using a mixture of $O_2$ and nitrogen for the carrier gas via line $L_1$ or by using a mixture of $O_2$, nitrogen and less than 10% ozone by weight for the reactant gas via line $L_3$.

In another embodiment of the invention example 16 was modified by using a mixture of $O_2$ and less than 10% ozone modified by using a mixture of $O_2$ and ozone, where the weight percent of ozone present is greater than 0 percent but less than substantially 10 percent it is preferable to introduce ozone via line $L_3$.

An ozone generator (not shown) containing a standard electrodeless discharge tube and capable of producing a concentration of 10% ozone by weight or less from a feed stream of pure oxygen is attached to line $L_3$.

Figure 2:
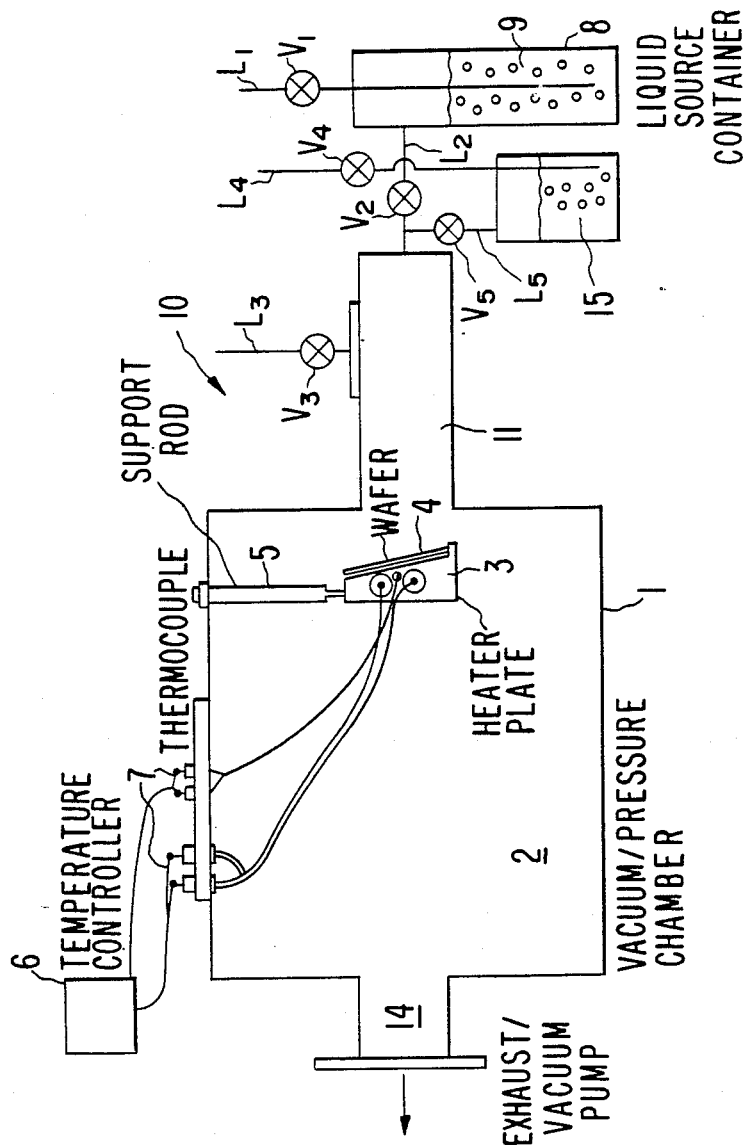
FIG. 2 shows a reactor similar to FIG. 1 including a second bubble chamber for use in depositing a doped $SiO_2$ film.

FIG. 2 shows a reactor suitable for producing a doped $SiO_2$ film. FIG. 2 is similar to FIG. 1 except that a second bubble chamber 15 is provided which contains a dopant source, for example trimethylphosphite or trimethylborate. A carrier gas such as $O_2$ or $N_2$ is introduced into the dopant source via line $L_4$, which is controlled by valve $V_4$. The doped gas passes via control valve $V_5$ and line $L_5$ into mixing chamber 11.

EXAMPLE 17

(not tested)

| Alkoxysilane: | any alkoxysilane |
|---|---|

-continued

| Carrier gas via Line $L_1$: | $O_2$ or Nitrogen |
|---|---|
| Reactant gas via Line $L_3$: | $O_2$ and less than 10% ozone by weight |
| Carrier gas via line $L_4$: | $O_2$ or Nitrogen |
| Flow rate via line $L_1$: | 20–100 sccm |
| Flow rate via line $L_3$: | 20–200 sccm |
| Flow rate via line $L_4$: | 20–100 sccm |
| Wafer temperature: | 300°–900° C. |
| Pressure: | 1 atmosphere to 0.5 torr |
| Dopant: | trimethylphosphite $P(OCH_3)_3$ |

The advantage of using ozone in the gas stream is that ozone readily oxidizes both phosphorous and boron hydrides and alkoxides which are used as dopant sources for doping $SiO_2$ films. Moreover, oxidation in the presence of ozone takes place at substantially lower temperatures than when pure $O_2$ is used as the carrier gas. Thus, while the temperature range shown in example 17 is 300°–900° C., the preferred temperature range is lower for selected alkoxysilanes. For example, for a trialkoxysilane the preferred temperature range is 300°–500° C., which does not damage the underlying semiconductor structure.

The above examples are meant to be exemplary and not limiting and in view of the above disclosure many modifications will be obvious to one of ordinary skill in the art without departing from the scope of the invention.

In particular, the precise configuration of the deposition reactor is not critical to using the methods of this invention and one of ordinary skill in the art will be able to employ other suitable reactors in view of the disclosures made herein.

I claim:

1. A methyl of forming a $SiO_2$ based layer by chemical vapor deposition on a semiconductor structure, the method comprising the steps of:

introducing the semiconductor substrate into a reactor chamber;

heating the semiconductor structure to a predetermined temperature in the range of substantially 300° C.–500° C.;

introducing a predetermined gas reactant into the reactor chamber, with the first gas reactant being selected from a trialkoxysilane having the formula

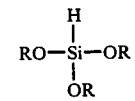

where R is a method group, and ethyl gruop, or a propyl group;

introducing a predetermined oxidizing gas reactant, consisting essentially of a mixture of oxygen and ozone, where the weight percentage of ozone present in the oxidizing gas reactant is greater than 0 percent but less than substantially 10 percent, into the reactor chamber, where the reactor chamber pressure is between substantially 0.5 Torr and one atmosphere;

allowing the gas reactant and oxidizing gas reactant to thermally react to produce molecules of $SiO_2$; and allowing the $SiO_2$ molecules thus produced to be deposited on the semiconductor structure.

* * * * *